United States Patent
Yan

(10) Patent No.: US 11,171,262 B2
(45) Date of Patent: Nov. 9, 2021

(54) LED MODULE

(71) Applicant: Shenzhen Refond Optoelectronics Co., Ltd., Shenzhen (CN)

(72) Inventor: Siping Yan, Shenzhen (CN)

(73) Assignee: Shenzhen Refond Optoelectronics Co., Ltd., Shenzhen (CN)

(*) Notice: Subject to any disclaimer, the term of this patent is extended or adjusted under 35 U.S.C. 154(b) by 311 days.

(21) Appl. No.: 16/327,080

(22) PCT Filed: Sep. 27, 2018

(86) PCT No.: PCT/CN2018/107949
§ 371 (c)(1),
(2) Date: Feb. 21, 2019

(87) PCT Pub. No.: WO2019/223207
PCT Pub. Date: Nov. 28, 2019

(65) Prior Publication Data
US 2021/0135060 A1    May 6, 2021

(30) Foreign Application Priority Data

May 25, 2018 (CN) .......................... 201820788576.2

(51) Int. Cl.
*H01L 33/48* (2010.01)
*H01L 25/075* (2006.01)
*H01L 33/54* (2010.01)
*H01L 27/15* (2006.01)

(52) U.S. Cl.
CPC .......... *H01L 33/486* (2013.01); *H01L 25/075* (2013.01); *H01L 33/54* (2013.01); *H01L 27/15* (2013.01); *H01L 27/153* (2013.01)

(58) Field of Classification Search
CPC ..... H01L 33/48; H01L 33/483; H01L 33/486; H01L 27/15; H01L 27/153
See application file for complete search history.

(56) References Cited

U.S. PATENT DOCUMENTS

| | | | | |
|---|---|---|---|---|
| 5,959,316 A * | 9/1999 | Lowery | ................. | H01L 33/507 257/98 |
| 8,426,227 B1 * | 4/2013 | Bibi | ....................... | H01L 33/06 438/27 |
| 8,901,583 B2 * | 12/2014 | Chan | ................... | H01L 25/0753 257/89 |
| 9,024,349 B2 * | 5/2015 | Chitnis | ................... | H01L 33/62 257/99 |
| 9,159,888 B2 * | 10/2015 | Chitnis | ................... | H01L 33/62 |
| 9,691,949 B2 * | 6/2017 | Reiherzer | ............... | H01L 33/56 |

(Continued)

FOREIGN PATENT DOCUMENTS

| CN | 101392891 A | 3/2009 |
|---|---|---|
| CN | 202917486 U | 5/2013 |

(Continued)

*Primary Examiner* — David A Zarneke
(74) *Attorney, Agent, or Firm* — Vivacqua Crane, PLLC

(57) ABSTRACT

A LED module, comprising a printed circuit board, wherein the LED module further comprises a plurality of light emitting units provided onto the printed circuit board, wherein each light emitting unit comprises a plurality of white light devices sets and/or a plurality of color light devices sets spaced less than 1 mm between one another.

11 Claims, 4 Drawing Sheets

(56) References Cited

U.S. PATENT DOCUMENTS

2014/0159071 A1* 6/2014 Choi ................ H01L 33/10
                                                    257/88
2015/0194585 A1* 7/2015 Kim ................ H01L 33/62
                                                    257/99

FOREIGN PATENT DOCUMENTS

CN      206210351 U    5/2017
JP      2008218733 A   9/2008

* cited by examiner

LED MODULE

CROSS REFERENCE TO RELATED APPLICATIONS

This application is a U.S. National Stage Application under 35 U.S.C 371 of PCT Application No. PCT/CN2018/107949 having an international filing date 27 Sep. 2018, which PCT application claims the benefit of CN Application No. 201820788576.2 filed 25 May 2018, the entire disclosures of which are hereby incorporated herein by reference.

TECHNICAL FIELD

The present disclosure relates to lighting technical field, and in particular to a LED module.

BACKGROUND

Either WRGB devices or a combination of RGB full-color devices and white light devices are generally adopted during a mounting process in the technical field of decorative lighting using adjustable light of high brightness and wide-range chromaticity. When WRGB devices are adopted in mass production, a fraction defective of any one of four colors W/R/G/B will lead to a relatively low overall yield of the devices and therefore is unfavorable for scalable manufacture and popularization of the lighting.

SUMMARY

The present disclosure aims to provide a LED module intending to solve the problem of low overall yield of devices that hardly contributes to their scalable manufacture and popularization, which is caused by the fraction defective of 4 colors W/R/G/B during mass production.

To achieve the above object, the technical solution of present disclosure is as follows: a LED module is provided, comprising a printed circuit board, on which light emitting units including white light devices sets and/or color light devices sets spaced within 1 mm are arranged.

Further, the white light devices set comprises at least a white light device and the color light devices set comprises at least a monochromatic light device.

Further, the printed circuit board is a rigid circuit board or a flexible circuit board.

Further, the white light devices of the white light devices set include several plastic housings used for LED chips capsulation, fluorescent glue disposed within the plastic housing and metal fasteners for securing the plastic housing to the circuit board.

Further, the color light devices in the color light devices set include several plastic housings used for LED chips capsulation and metal fasteners for securing the plastic housings to the circuit board.

Further, the metal fastener includes a fixing portion inserted to secure itself into the plastic housing and a folded foot part used to connect with the fixing portion and fixedly joint the printed circuit board.

Further, the white light devices set includes a first white light device of first color temperature and a second white light device of second color temperature while the color temperature of the first white light device is higher than that of the second one, the color light devices set includes a red light device, a green light device and a blue light device.

Further, distance fluctuation of adjacent device light exiting surfaces within the white light devices set and/or color light devices set of the emitting unit is no more than 0.5 mm.

The advantages of the present disclosure are as follows: comparing to the prior art, the disclosure adopts small-size white light devices set and/or color light devices set for mounting into the module, wherein the clearance of devices is less than 1 mm, the space between the devices is smaller, light after mixing demonstrates advantageous performance, while the devices are packaged independently and has a relatively high overall yield, which contributes to scalable manufacture and popularization of the LED module.

BRIEF DESCRIPTION OF THE DRAWINGS

In order to more clearly illustrate the technical solutions of embodiments of the present disclosure, drawings used in the embodiments or the background description will be briefly described below. Obviously, the drawings in the following description are only some illustrations of embodiments of the disclosure. Other drawings can also be obtained by one skilled in the art without any creative works according to the drawings herein.

Figure 1:
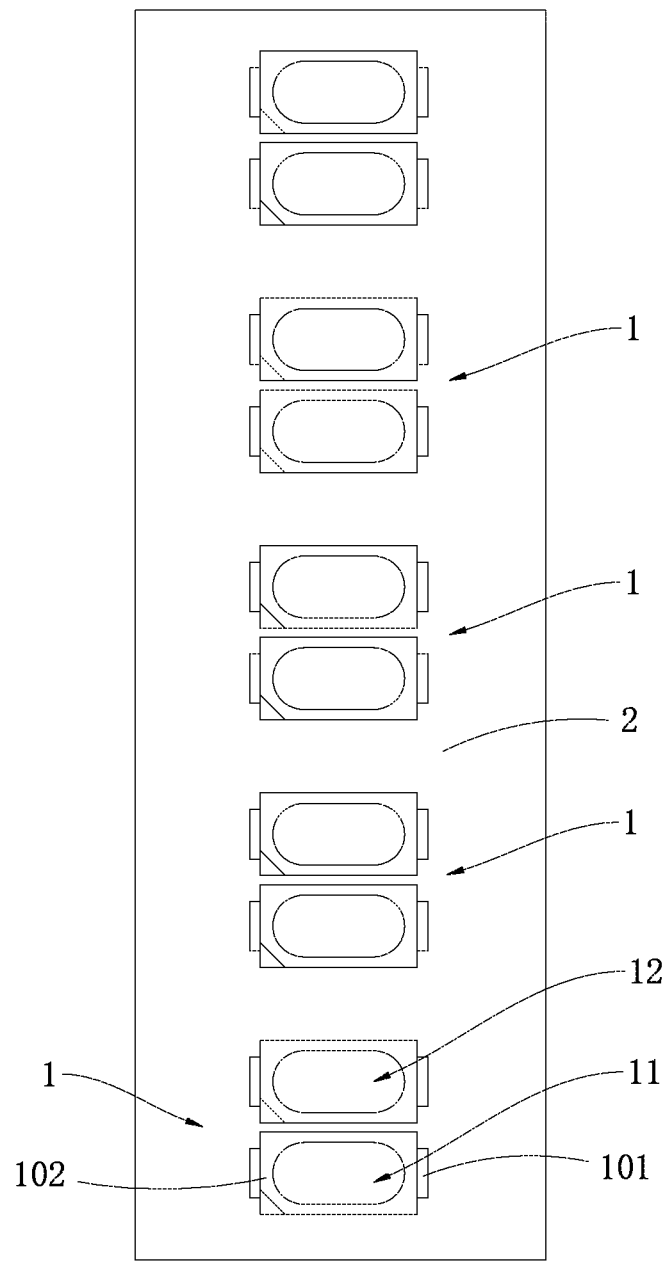
FIG. 1 shows a structural illustration of a LED module of the first embodiment of present disclosure.

REFERENCE NUMERAL LIST 1. light emitting unit;
11. white light device;
12. monochromatic light device;
13. first color temperature white light device;
14. second color temperature white light device;
15. red light device;
16. green light device;
17. blue light device;
2. printed circuit board;
101. fixing portion;
102. plastic housing;
103. folded foot part.

DETAILED DESCRIPTION

In order to further clarify the technical problems solved by the disclosure, technical solutions and beneficial effects hereof, the present disclosure will be further illustrated in detail below with reference to the drawings and the embodiments. It should be understood that the specific embodiments described herein are merely used for illustration of the disclosure instead of limiting the disclosure.

It should be noted that when an element is 'secured to' or 'set arranged to' another element, the element can be substantially on the other element directly or indirectly. When an element is 'connected to' another element, the element can be substantially connected to the other element directly or indirectly.

It should be understood that the directions or positional relationships indicated by terms such as Length, Width, Up, Down, Front, Back, Left, Right, Vertical, Horizontal, Top, Bottom, Inside, Outside are based on the directions or positional relationships indicated by the drawings with the purpose of facilitating to describe the present disclosure and simplify description instead of referring or indicating the device or element referred herein must have specific position, form and operate with given direction and therefore cannot be construed as limitation to the present disclosure.

Furthermore, terms 'the first' and 'the second' is merely used for describing purpose instead of being construed as referring or indicating relative importance or implicitly indicating the number of technical features indicated. Thus, features defined as 'first' or 'second' may include one or more than one of the features either explicitly or implicitly. In the description of the present disclosure, term "multiple" means two or more than two unless specific definitions are given.

Figure 3:
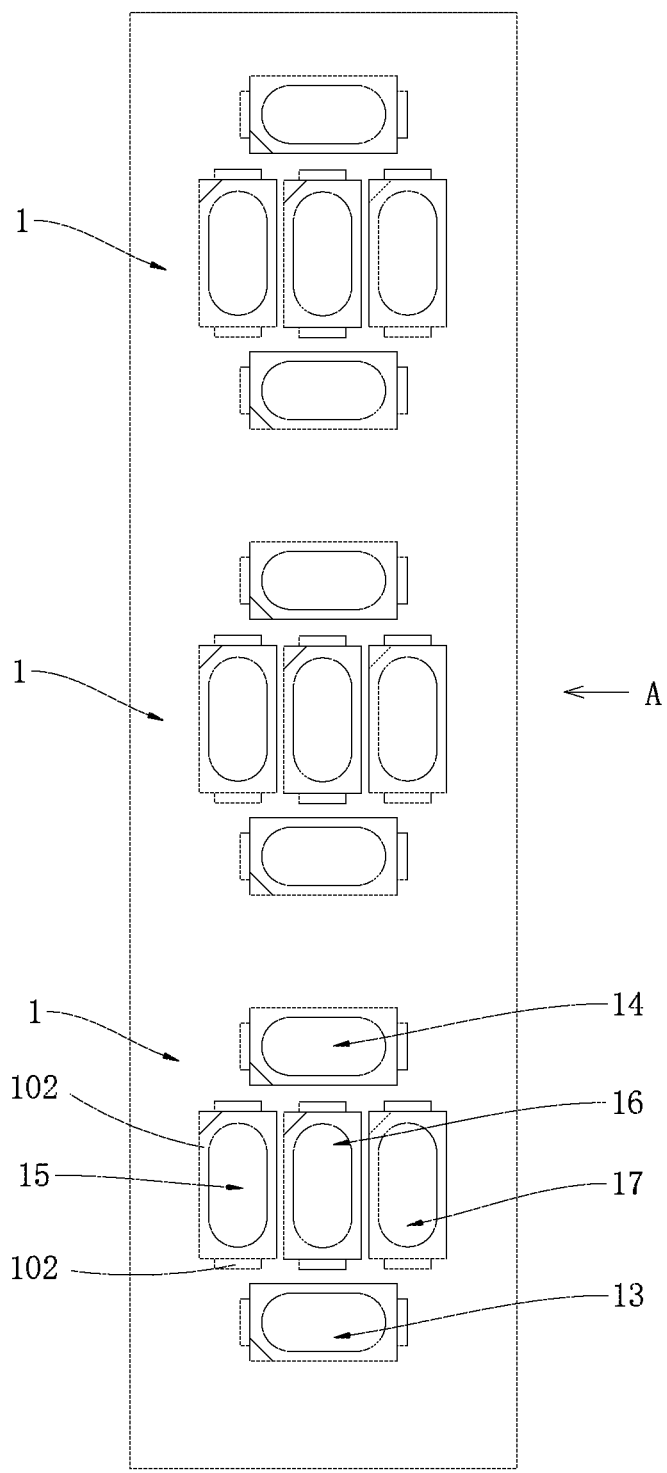
FIG. 3 shows a structural illustration of a LED module of the second embodiment of present disclosure.

Referring to FIG. 1 and FIG. 3, description of a LED module according to the present disclosure will be provided. The LED module, comprising a printed circuit board 2, multiple emitting units 1 which are disposed on the printed circuit board 2, wherein the emitting unit 1 comprises multiple white light devices sets and color light devices sets which are spaced arranged within no more than 1 mm distance from each other.

Comparing to the prior art, a LED module provided by the present disclosure adopts smaller-sized white light devices set and color light devices set both mounted into the module, wherein the devices are spaced no more than 1 mm distance from one another and the color of the light hereof can be controlled respectively by a controller. The color of the lights after mixing is uniform and demonstrates advantageous performance. The devices are packed independently and has a relatively high overall yield, making it suitable for scalable manufacture and popularization.

Figure 2:
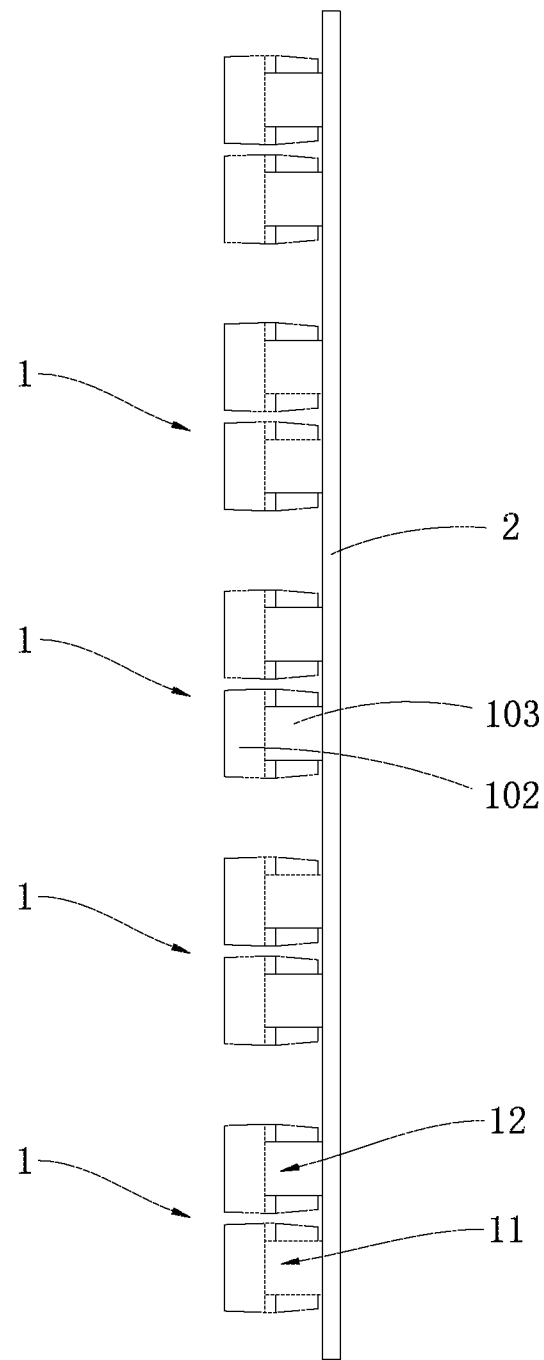
FIG. 2 shows the side view of FIG. 1.

Further, referring to FIG. 1 and FIG. 2, as an embodiment of a LED module according to the disclosure, the white light devices set comprises at least a white light device 11 and the color light devices set comprises at least a monochromatic light device 12. Adjustment of brightness and chromaticity can be conducted by the cooperation of at least one white light device 11 and at least a monochromatic light device 12. The monochromatic light device 12 can emit a single spectrum of light, such as red, blue, green or yellow light.

Furthermore, as an embodiment of a LED module according to the disclosure, the distance fluctuation of adjacent device light exiting surface within the white light devices set and/or color light devices set in the emitting unit 1 is no more than 0.5 mm. The distance fluctuation of the light exiting surface between any two of the red light device 15, green light device 16, blue light device 17, the first color temperature white light device 13 and the second color temperature white light device 14 is no more than 0.5 mm, in which way should the lights are mixed more uniformly.

Figure 4:
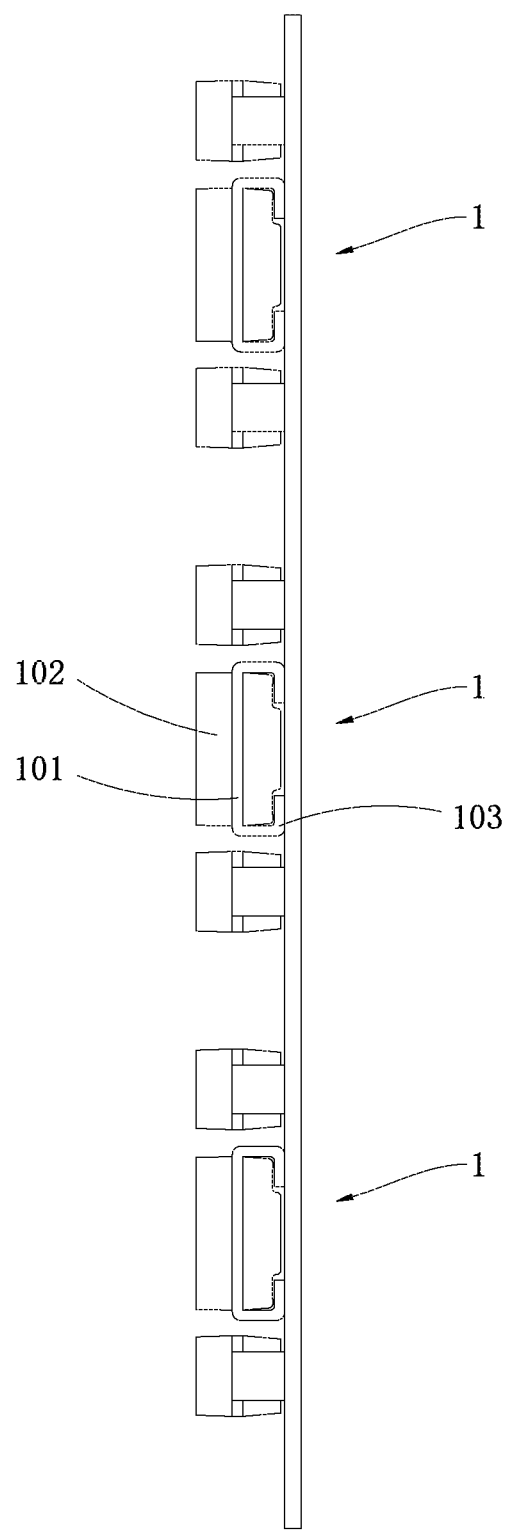
FIG. 4 shows the side view of FIG. 3.

Furthermore, referring to FIG. 3 and FIG. 4, as an embodiment of a LED module provided by the disclosure, the white light devices set comprises a first color temperature device 13 and a second color temperature device 14 which color temperature is lower than that of the first one; wherein the color light devices set comprises a red light device 15, a green light device 16 and a blue light device 17. Furthermore, the brightness and chromatic range can be adjusted by controlling the first color temperature white light device 13, the second color temperature white light device 14 and the three primary color monochrome device of the disclosure, wherein the space between any two device in each unit is no more than 1 mm, and the external dimensions of the devices are uniform with a length of 1.8-2.2 mm, width of 0.8-1.1 mm and height of 0.8-1.2 mm.

Furthermore, referring to FIG. 3 and FIG. 4, as an embodiment of a LED module according to the disclosure, the red light device 15, green light device 16 and the blue light device 17 are aligned one another in a longitudinal direction, while the first color temperature white light device 13 and the second color temperature white light device 14 are respectively disposed to a left and right side of the color light devices such as red light device 15, green light device 16 and blue light device 17. With such compact installation, the color of mixed lights demonstrates an advantageous uniform lighting performance.

Furthermore, referring to FIG. 3 and FIG. 4, as an embodiment of a LED module according to the disclosure, the direction of the width of red light device 15, green light device 16 and blue light device 17 equals the same with the longitudinal direction while the direction of length of the first color temperature white light device 13 and the second color temperature white light device 14 equals the same with the longitudinal directions. With such compact installation, the color of the mixed lights demonstrates an advantageous uniform lighting performance. The red light device 15, green light device 16 and the blue light device 17 are arranged at the longitudinal direction with compact installation while the first color temperature white light device 13 and the second color temperature white light device 14 are respectively set both sides of the color light devices, providing convenience for light adjustment after which should the color of the light demonstrate an advantageous mixing performance.

Furthermore, referring to FIG. 3 and FIG. 4, as an embodiment of a LED module according to the disclosure, red light device 15, green light device 16 and blue light device 17 are aligned by one following another longitudinally from a rear side to a front side, the second color temperature device 14 is disposed to the left side of the red light device 15, green light device 16 and blue light device 17 aligned by one following another, while the first color temperature white light device 13 is disposed to the right side of the red light device 15, green light device 16 and blue light device 17. The first color temperature white light device 13 and the second color temperature white light device 14 are disposed to both sides of the color light devices, which arrangement facilitate light adjustment, after which should the color of the light demonstrate an advantageous mixing performance (As shown in the drawings, "A" indicates the front side, 'front' 'rear' 'left' 'right' are merely for the purpose of convenience in description but not limitation).

Furthermore, as one of the embodiments of a LED module of the present disclosure, when a flexible circuit board is adopted as a printed circuit board 2 herein should it demonstrates better adaptability.

Furthermore, as an embodiment of a LED module provided by the disclosure, referring to FIG. 1 and FIG. 3, the white light device of the white light devices set comprises multiple plastic housing 102 used for LED chip packaging, the fluorescent glue disposed within the plastic housings and a metal fastener for securing the plastic housing to the circuit board.

Furthermore, a short wavelength LED chip such as blue light or purple light LED chip can be placed within a single LED device, after which an encapsulation by fluorescent glue can be made to allow the device to emit white light or color lights of high bands.

Furthermore, referring to FIG. 1 and FIG. 3, as an embodiment of a LED module according to the disclosure, the color light devices of the color light devices set comprise multiple plastic housings 102 used for LED chip encapsulation and the metal fastener for securing the plastic housings 102 to the circuit board 2.

Furthermore, referring to FIG. 1 and FIG. 4, as an embodiment of a LED module according to the disclosure, the metal fastener includes a fixing portion 101 inserted to secure itself into the plastic housings 102 and a folded foot part 103 used to connect with the fixing portion 101 and fixedly joint the printed circuit board 2. The folding foot part 103 is folded to the lower side of the plastic housing 102 and is attached to the printed circuit board 2 to cover the lower part of the plastic housing 102 so as to form the so called folding foot part. The fastener 101 is located at a central part of the plastic housing 102, and the folding foot part 103 is bent to cover the lower part of the plastic housing 102.

When applying rigid printed circuit boards, flat brackets without folded foot can be adopted to conduct device capsulation and module mounting.

The above are merely the preferred embodiments of the present disclosure, but the present disclosure is not limited thereto. Any modifications, equivalent substitutions and improvements made within the principle and scope of the present disclosure should be included within the protection scope of the present disclosure.

The invention claimed is:

1. A LED module, comprising a printed circuit board; a plurality of light emitting units provided onto the printed circuit board, wherein each light emitting unit comprises a plurality of white light devices sets and/or a plurality of color light devices sets spaced less than 1 mm between one another; wherein,
 the white light devices set comprises a first color temperature white light device and a second color temperature white light device which color temperature is lower than that of the first one, and the color light devices set comprises a red light device, a green light device and a blue light device; and
 the red light device, green light device and the blue light device are aligned with each other in a longitudinal direction, while the first color temperature white light device and the second color temperature white light device are orientated in a direction perpendicular to orientation of either one of the red light device, green light device and the blue light device, and are respectively disposed to a left and right side of the color light devices set of the red light device, green light device and the blue light device, in order to uniform lighting performance.

2. The LED module according to claim 1, wherein the white light devices set comprises at least one white light device, and the color light devices set comprises at least one monochromatic light device.

3. The LED module according to claim 1, wherein the printed circuit board is a rigid circuit board or a flexible circuit board.

4. The LED module according to claim 1, wherein the white light device of the white light devices set comprises: a plastic housing used for LED chip capsulation, fluorescent glue disposed within the plastic housing and a metal fastener for securing the plastic housing to the circuit board.

5. The LED module according to claim 1, wherein a color light device in the color light devices set comprises a plastic housing used for LED chip capsulation and a metal fastener for securing the plastic housing to the circuit board.

6. The LED module according to claim 4, wherein the metal fastener comprises a fixing portion inserted to secure itself into the plastic housing and a folded foot part used to connect with the fixing portion and fixedly joint the printed circuit board.

7. The LED module according to claim 1, wherein the white light devices set comprises a first color temperature white light device and a second color temperature white light device which color temperature is lower than that of the first one, and the color light devices set comprises a red light device, a green light device and a blue light device.

8. The LED module according to claim 1, wherein the distance fluctuation of adjacent device light exiting surfaces within the white light devices set and/or color light devices set of the emitting unit is no more than 0.5 mm.

9. The LED module according to claim 2, wherein the printed circuit board is a rigid circuit board or a flexible circuit board.

10. The LED module according to claim 5, wherein the metal fastener comprises a fixing portion inserted to secure itself into the plastic housing and a folded foot part used to connect with the fixing portion and fixedly joint the printed circuit board.

11. The LED module according to claim 2, wherein the white light devices set comprises a first color temperature white light device and a second color temperature white light device which color temperature is lower than that of the first one, and the color light devices set comprises a red light device, a green light device and a blue light device.

* * * * *